US010686630B1

(12) United States Patent
David et al.

(10) Patent No.: US 10,686,630 B1
(45) Date of Patent: Jun. 16, 2020

(54) METHOD AND APPARATUS FOR BLIND CHANNEL ESTIMATION

(71) Applicant: Mellanox Technologies, Ltd., Yokneam (IL)

(72) Inventors: Eyal David, Atzmon (IL); Shai Cohen, Haifa (IL); Johan Jacob Mohr, Copenhagen (DK); Daniel Kedar, Harish (IL); Stanislav Gurtovoy, Nesher (IL); Ran Sela, Givat Shmuel (IL); Aviv Berg, Beit Keshet (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/511,771

(22) Filed: Jul. 15, 2019

(51) Int. Cl.

| | |
|---|---|
| ***H03F 1/32*** | (2006.01) |
| ***H04L 25/02*** | (2006.01) |
| ***H04L 25/03*** | (2006.01) |
| ***H04L 27/06*** | (2006.01) |
| ***H04L 25/49*** | (2006.01) |

(52) U.S. Cl.
CPC ...... *H04L 25/0238* (2013.01); *H04L 25/0204* (2013.01); *H04L 25/0307* (2013.01); *H04L 25/4917* (2013.01); *H04L 27/06* (2013.01); *H03F 1/3247* (2013.01)

(58) Field of Classification Search
USPC ............................ 375/232, 233, 229; 360/65
See application file for complete search history.

(56) References Cited

U.S. PATENT DOCUMENTS

2003/0035236 A1* 2/2003 Satoh ..................... G11B 5/035 360/65
2007/0253475 A1* 11/2007 Palmer .................. H04L 25/069 375/229
2008/0056344 A1* 3/2008 Hidaka ................. H04L 25/063 375/232
2011/0317754 A1* 12/2011 Yang ................... H04L 25/0307 375/233
2012/0314756 A1* 12/2012 Leibowitz ......... H04L 25/03146 375/233
2016/0352557 A1* 12/2016 Liao .................... H04L 27/3809
2016/0373790 A1* 12/2016 Tsukagoshi ............ H04N 19/70

* cited by examiner

*Primary Examiner* — Eva Y Puente
(74) *Attorney, Agent, or Firm* — Alston & Bird LLP

(57) ABSTRACT

Embodiments are disclosed for channel estimation in a receiver of a communication system. An example method includes receiving, via a receiver of a communication system, an input signal. The example method further includes using a first event indicator embedded in an analog circuit of the receiver to slice the input signal to generate a sliced input signal and applying an offset to the input signal to generate an offsetted signal. The example method further includes using a second event indicator embedded in the analog circuit to slice the offsetted signal to generate a sliced offsetted signal. The example method further includes applying a first predefined delay to the sliced input signal and applying a second predefined delay to the sliced offsetted signal. The example method further includes generating a conditional ones signal based on the sliced input signal and the sliced offsetted signal and using the conditional ones signal to calibrate an equalizer embedded in the receiver.

18 Claims, 5 Drawing Sheets

METHOD AND APPARATUS FOR BLIND CHANNEL ESTIMATION

TECHNOLOGICAL FIELD

Embodiments of the present invention relate generally to a method and apparatus for blind channel estimation in communication systems, and particularly in a receiver for pulse amplitude modulation ("PAM") signals.

BACKGROUND

Communication systems are generally composed of a transmitter, a receiver, and a channel. The transmitter generates a signal conveying information, which, after being transmitted over a channel, is received and recovered at the receiver. Channels may be dispersive which may disperse both time and frequency of a transmitted signal. To effectively recover information in the transmitted signal, a receiver may be implemented with equalizers configured to mitigate the effect of the dispersion. Channel estimation is often essential for receiver tuning and for performance estimation for the receiver, which may in turn be helpful for receiver tuning. The present invention presents a method and apparatus for blind channel estimation in a receiver.

BRIEF SUMMARY

Example embodiments described herein disclose a method and apparatus for blind channel estimation in a receiver. The details of some embodiments of the subject matter described in this specification are set forth in the accompanying drawings and the description below. Other features, aspects, and advantages of the subject matter will become apparent from the description, the drawings, and the claims. In accordance with an example embodiment, a method of channel estimation in a receiver of a communication system is provided. The method includes receiving, via a receiver of a communication system, an input signal. The input signal encodes a plurality of bits in a number of amplitude levels. The method further includes using a first event indicator embedded in an analog circuit of the receiver to slice the input signal to generate a sliced input signal. The method further includes applying an offset to the input signal to generate an offsetted signal. The method further includes using a second event indicator embedded in the analog circuit to slice the offsetted signal to generate a sliced offsetted signal. The method further includes applying a first predefined delay to the sliced input signal. The method further includes applying a second predefined delay to the sliced offsetted signal. The method further includes generating a conditional ones signal based on the sliced input signal and the sliced offsetted signal. The method further includes using the conditional ones signal to calibrate an equalizer embedded in the receiver.

In some embodiments, the input signal is a pulse amplitude modulation signal encoding the plurality of symbols in four amplitude levels. In some embodiments, the input signal is a pulse amplitude modulation signal encoding the plurality of symbols in two amplitude levels. In some embodiments, the offset is a predefined direct current offset. In some embodiments, applying the first predefined delay to the sliced input signal comprises using a set of delay circuit units. In some embodiments, applying the first predefined delay to the sliced input signal further comprises using a multiplexer to multiplex one or more outputs of the set of delay circuit units. In some embodiments, applying the second predefined delay to the sliced offsetted signal comprises using a second set of delay circuit units. In some embodiments, generating a conditional ones signal based on the sliced input signal and the sliced offsetted signal comprises: feeding an output of the multiplexer and an output of the second set of delay circuit units into an AND gate; and using a counter to count an output of the AND gate.

In accordance with another example embodiment, an analog conditional one counting circuit embedded in a receiver of a communication system is provided. The analog conditional one counting circuit is configured to receive an input signal. The input signal encodes a plurality of bits in a number of amplitude levels. The analog conditional one counting circuit is further configured to use a first event indicator embedded in an analog circuit of a receiver of a communication system to slice the input signal to generate a sliced input signal. The analog conditional one counting circuit is further configured to apply an offset to the input signal to generate an offsetted signal. The analog conditional one counting circuit is further configured to use a second event indicator embedded in the analog circuit to slice the offsetted signal to generate a sliced offsetted signal. The analog conditional one counting circuit is further configured to apply a first predefined delay to the sliced input signal. The analog conditional one counting circuit is further configured to apply a second predefined delay to the sliced offsetted signal. The analog conditional one counting circuit is further configured to generate a conditional ones signal based on the sliced input signal and the sliced offsetted signal. The analog conditional one counting circuit is further configured to use the conditional ones signal to calibrate an equalizer embedded in the receiver.

In some embodiments, the input signal is a pulse amplitude modulation signal encoding the plurality of symbols in four amplitude levels. In some embodiments, the input signal is a pulse amplitude modulation signal encoding the plurality of symbols in two amplitude levels. In some embodiments, the offset is a predefined direct current offset. In some embodiments, applying the first predefined delay to the sliced input signal comprises using a set of delay circuit units. In some embodiments, applying the first predefined delay to the sliced input signal further comprises using a multiplexer to multiplex one or more outputs of the set of delay circuit units. In some embodiments, applying the second predefined delay to the sliced offsetted signal comprises using a second set of delay circuit units. In some embodiments, generating a conditional ones signal based on the sliced input signal and the sliced offsetted signal comprises: feeding an output of the multiplexer and an output of the second set of delay circuit units into an AND gate; and using a counter to count an output of the AND gate.

In some embodiments, an analog conditional one counting circuit is provided. The analog conditional one counting circuit comprises a first event indicator and a second event indicator. The first event indicator is configured to receive an input signal as input to generate a sliced input signal and the second event indicator is configured to receive an offsetted signal of the input signal as input to generate a sliced offsetted signal. The analog conditional one counting circuit further comprises a first set of delay circuit units configured to generate one or more delayed signals based on the sliced input signal. The analog conditional one counting circuit further comprises a second set of delay circuit units configured to generate a delayed offsetted signal based on the sliced offsetted signal. The analog conditional one counting circuit further comprises a multiplexer configured to multiplex the one or more delayed signals. The analog conditional one counting circuit further comprises an AND gate configured to receive an output of the multiplexer and the delayed offsetted signal as input. The analog conditional one counting circuit further comprises a counter configured to count an output of the AND gate.

In some embodiments, the analog conditional one counting circuit further comprises a counter configured to count the sliced offsetted signal.

The above summary is provided merely for purposes of summarizing some example embodiments to provide a basic understanding of some aspects of the present invention. Accordingly, it will be appreciated that the above-described embodiments are merely examples and should not be construed to narrow the scope or spirit of the present invention in any way. It will be appreciated that the scope of the present invention encompasses many potential embodiments in addition to those here summarized, some of which will be further described below.

BRIEF DESCRIPTION OF THE DRAWINGS

Figure 1A:
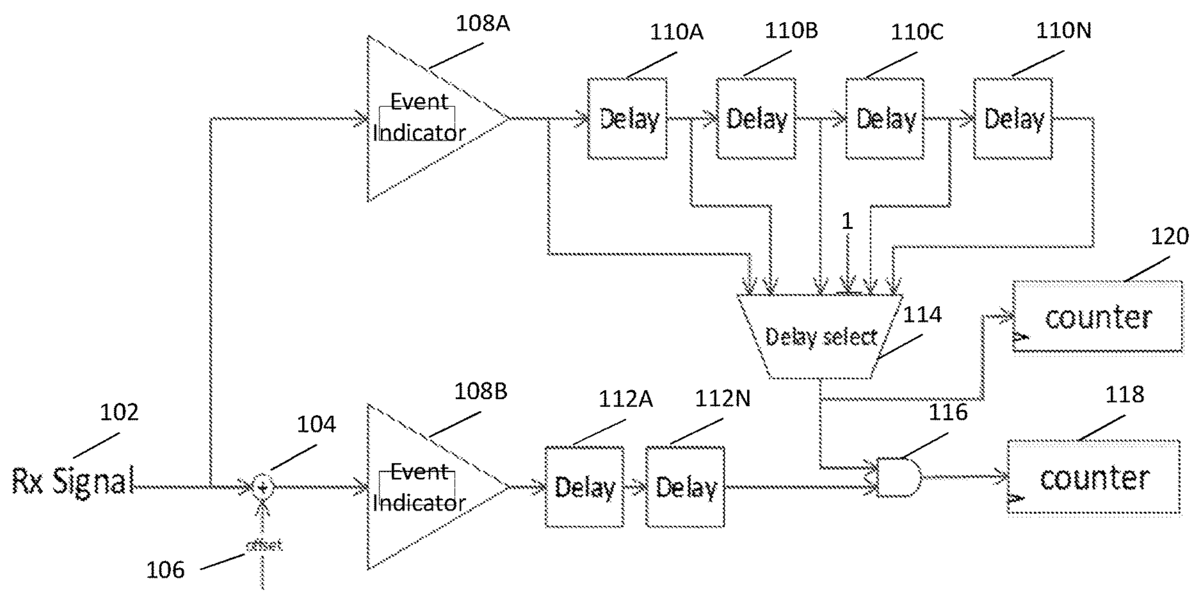
Figure 1B:
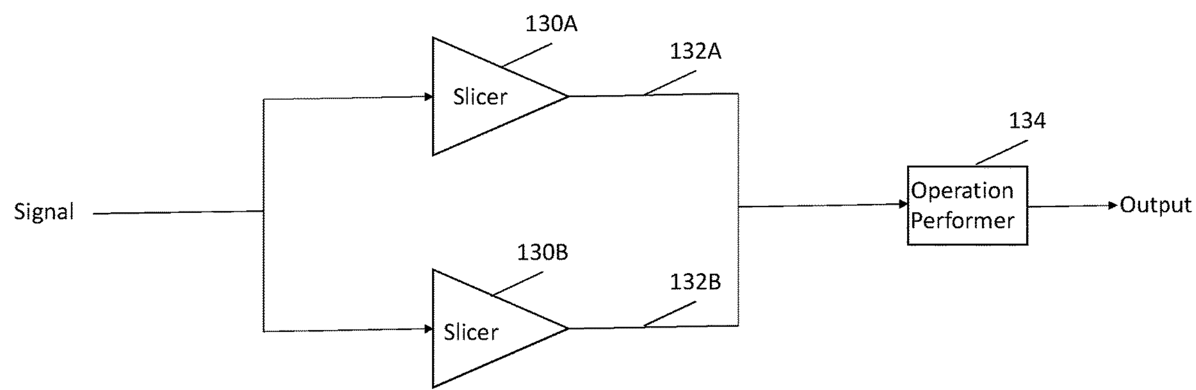
Figure 2:
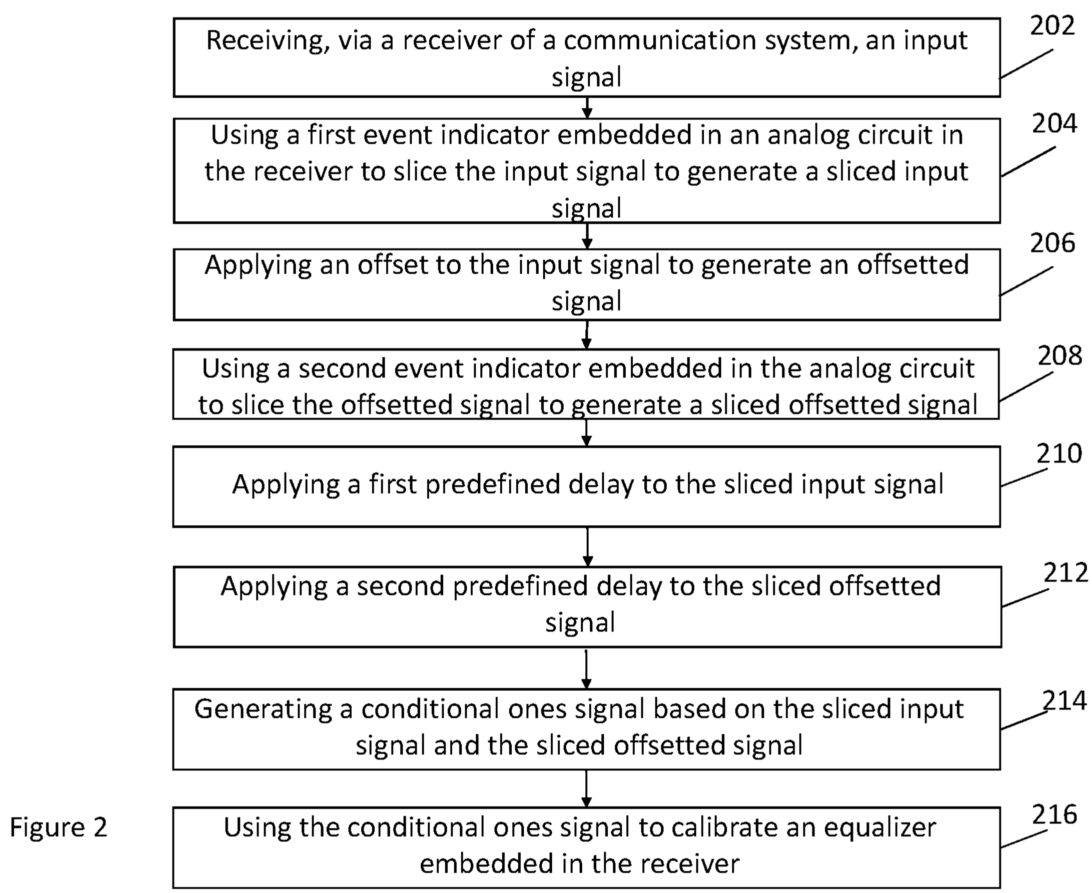
Figure 3:
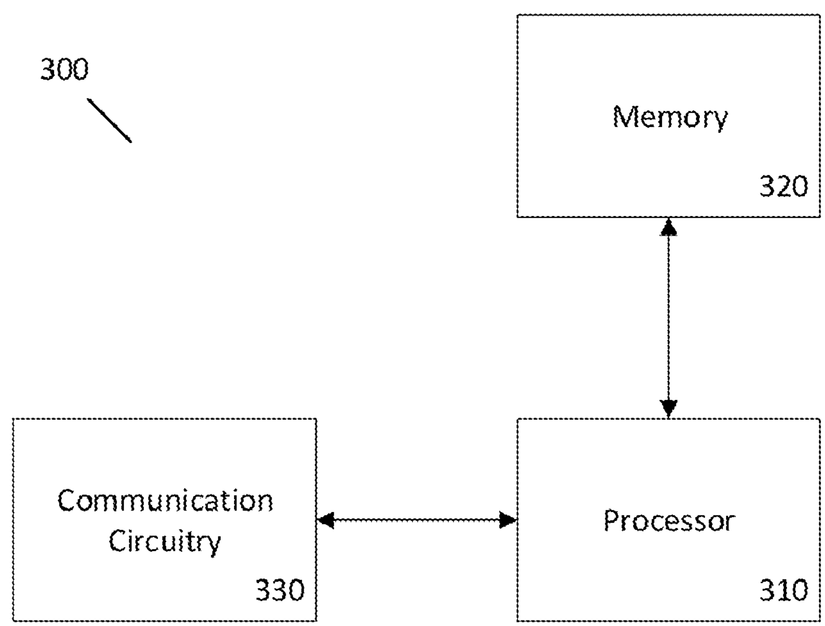
Figure 4:
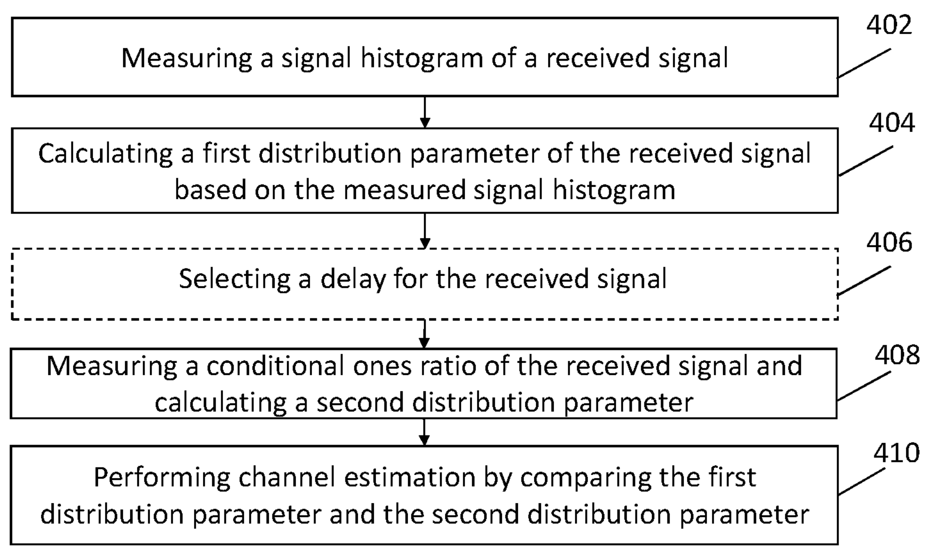

Having thus described the disclosure in general terms, reference will now be made to the accompanying drawings, which are not necessarily drawn to scale, and wherein:

FIG. 1A illustrates an analog conditional one counting circuit according to example embodiments of the present invention;

FIG. 1B illustrates an event indicator according to example embodiments of the present invention;

FIG. 2 is a flowchart illustrating an example method of operation of a communication system embedded with a receiver having an analog conditional one counting circuit according to example embodiments of the present invention;

FIG. 3 illustrates an example computing system that may be embedded in the communication system; and FIG. 4 is flowchart illustrating another example method of operation of a communication system embedded with a receiver having an analog conditional one counting circuit according to example embodiments of the present invention.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein, are not provided to convey any qualitative assessment, but instead merely to convey an illustration of an example. Thus, use of any such terms should not be taken to limit the spirit and scope of embodiments of the present invention.

Electrical/optical communication systems generally include a transmitter, a receiver, and a channel. The transmitter generates a signal conveying information, which, after being transmitted over a channel, is received and recovered at the receiver. In the real world, transmission channels are non-ideal and introduce various unwanted effects that cause distortion of the signals, making the communication less reliable. For example, the channel may have a transfer function that introduces changes in the signal transmitted in the form of amplitude and/or phase changes. These changes distort the signal received at the receiver. Moreover, during transmission, intersymbol interference ("ISI") may occur. ISI is a form of distortion of a signal in which one symbol interferes with subsequent symbols. The presence of ISI makes the communication less reliable. In addition, the transmission channel may also distort the signal by attenuating higher frequencies more than lower frequencies. In addition, channels may be dispersive such that the signal energy associated with each symbol maybe spread out in time. All of these unwanted effects distort the signal in the transmission process. Therefore, equalization may be needed to overcome these unwanted effects and to accurately reconstruct the signal.

Many receivers for high speed communication are equipped with analog equalizers, such as continuous time linear equalizer ("CTLE") circuits, feed forward equalizer ("FFE") circuits, or the like. These type of analog circuits are generally power efficient.

A channel often times acts as a low-pass filter for the signal transmitted, For example, the magnitude of the low frequency component of a signal may stay the same, but the magnitude of the high frequency component may be lessened. Accordingly, if the transmitted signal has very high frequency, the signal may become hugely extenuated, making it hard to detect and decode on the received side. In some conventional systems, a CTLE circuit may be able to serve as a high pass filter at the receiver in order to tune down the magnitude of the low frequency component, thereby recovering the signal.

Channel estimation provides essential information to equalizers for equalizing the received signal. Channel estimation may be categorized as non-data-aided or data-aided. Non-data-aided channel estimation may also be called as blind estimation, as it operates without data on the transmitted signal and relies on statistics of the received signals. On the contrary, data-aided channel estimation uses transmitted data as training data. Channel estimation can be essential for tuning various parameters of an equalizer such as a CTLE, such as zero, amplitude of gain, and amplified frequency.

Channel estimation often utilizes cross-correlation measurements, which may be difficult to implement in these analog circuits. For example, a CTLE circuit may be tuned by experimenting with different configurations for the CTLE or by utilizing FFE tuning results. However, such tuning would require a long tuning time, which may be not preferred in various situations. Receiver performance may be estimated by eye diagram measurements; however eye diagram measurement only provides a grand total estimation of performance without revealing any detail about the root cause for the issue. For example, a sub-optimal performance may be caused by reflections, intersymbol interference ("ISI"), or other factors. Standalone eye diagram measurement by itself would thus not reveal such root causes for the issue, and channel estimation may instead be needed for uncovering the root cause of performance issues.

Implementing channel estimation in a receiver is a fine balance of power consumption, size, tuning time, and accuracy. Embodiments of the present invention are provided that comprise a method and apparatus for blind channel estimation in communication systems. Embodiments of the present invention utilize an "ones ratio" measurement that measures the histogram of an incoming signal and conditions the "ones ratio" measurement with an event to measure "conditional ones ratio," which enables measuring the signal histogram under different conditions. Dependency between the signal and the conditions may be deduced by measuring changes in the signal histogram at different conditions. Conditioning the histogram by previous or next symbols may also enable measurement of the impact of previous/next symbols on the received signal, which can be used to derive the channel pulse response.

FIG. 1A illustrates an analog conditional one counting circuit according to example embodiments of the present invention. Embodiments of the analog conditional one counting circuit 100 may be utilized to measure conditional ones, previously described.

In some embodiments, the conditional one counting circuit comprises a offset unit 104, a first event indicator 108A and a second event indicator 108B, a first set of one or more delay circuit units 110A to 110N, a second set of delay circuit units 112A to 112N, a multiplexer 114 serving as a delay select, an AND gate 116, a counter 118, and optionally a second counter 120. The conditional one counting circuit may be embedded in a receiver of a communication system and may receive a received signal 102 as an input. In contrast, a traditional ones ratio counting circuit would only include an offset unit, a slicer to slice the received signal, and a counter. An event indicator is a circuit configured to slice an input signal to detect a defined state of an input signal. In some embodiments, the defined state may be a pre-defined signal level of the input signal of the event indicator.

The structure of an example event indicator is illustrated in FIG. 1B. As illustrated in FIG. 1B, the event indicator may comprise two slicers 130A and 130B configured to slice an input signal of the event indicator. Each of the slicers 130A and 130B may slice a pre-defined level of the input signal and generate an output 132A and 132B. The output 132A and 132B may be subsequently fed into an operation performer circuit 134. In various embodiments, the operation performer circuit may be configured to output one of the following: 132A, 132B, inverse of 132A, inverse of 132B, and result of an operation based 132A and 132B, such as XOR of 132A and 132B.

The first event indicator 108A may be configured to receive an input signal, such as the received signal 102, as input to generate a sliced input signal. The offset unit 104 may be configured to apply an offset 106 to the received signal 102 to generate an offsetted signal. In some embodiments, the offset may be a predefined direct current offset. In some embodiments, the predefined direct current offset may be adjustable.

In some embodiments, the second event indicator 108B may be configured to receive an offsetted signal of the input signal, such as the received signal 102, as an input for generating a sliced offsetted signal. The first set of delay circuit units 110A to 110N may be configured to generate one or more delayed signals based on the sliced input signal. The first delay circuit unit 110A in the first set of delay circuit units 110A to 110N may receive the sliced input signal as input and generate a delayed signal, then feed the delayed signal to the next delay circuit unit 110B in the first set of delay circuit units 110A to 110N. The next delay circuit unit 110B may in turn generate another delayed signal, then feed the delayed signal to the next delay circuit unit 110C in the first set of delay circuit units 110A to 110N. The number of the delay circuit units in the first set of delay circuit units 110A to 110N may be customizable and may correspond with the number of the one or more delayed signals.

The one or more delayed signals may be fed into the multiplexer 114, along with an optional constant 1 signal. The multiplexer 114 may be configured to multiplex the one or more delayed signals and, optionally, the constant 1 signal. In some embodiments, the multiplexer 114 may effectively serve as a delay select module for the one or more delayed signals. The multiplexer 114 may be set according to a channel phase measurement to be performed.

The second set of delay circuit units may be configured to receive the sliced offsetted signal as input and generate a delayed offsetted signal based on the sliced offsetted signal. The first delay circuit unit 112A in the second set of delay circuit units 112A to 112N may receive the sliced offsetted signal as input and generate a delayed signal, then feed the delayed signal to the next delay circuit unit in the second set of delay circuit units 112A to 112N. The output of the last delay circuit unit in the second set of delay circuit units 112A to 112N is the delayed offsetted signal. The number of the delay circuit units in the second set of delay circuit units 112A to 112N may be customizable.

The AND gate 116 may be configured to receive the output of the multiplexer and the delayed offsetted signal as input. The output of the AND gate may be fed into the counter 118 to count the output of the AND gate. In some embodiments, the counter 118 may be configured to count the output of the AND gate for a predefined period of time. In some embodiments, the analog conditional one counting circuit may also be utilized as a traditional ones counting circuit. By selecting no delay for the multiplexer 114 and using the optional second counter 120 to count the output of the multiplexer 114, the analog conditional one counting circuit may serve as a traditional ones counting circuit. In some embodiments, the second counter 120 may be the same counter as the counter 118 by introducing additional logic circuits in the analog conditional one counting circuit.

FIG. 2 is a flowchart illustrating an example method of operation of a communication system embedded with a receiver with an analog conditional one counting circuit according to example embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 2 may be performed by the analog conditional one counting circuit illustrated in FIG. 1A.

In some embodiments, at operation 202, the communication system receives, via the receiver, an input signal. In some embodiments, the input signal is a PAM-4 signal.

In some embodiments, at operation 204, the communication system uses a first event indicator embedded in an analog circuit of the receiver to slice the input signal to generate a sliced input signal. In some embodiments, the analog circuit is the analog conditional one counting circuit previously described in conjunction with FIG. 1A. In some embodiments, the first event indicator is the first event indicator 108A illustrated in FIG. 1A and the received signal is signal 102 illustrated in FIG. 1A.

In some embodiments, at operation 206, the communication system applies an offset to the input signal to generate an offsetted signal. In some embodiments, the communication system applies the offset, which may be the offset 106 previously described in conjunction with FIG. 1A, to the input signal by utilizing the offset unit 104 previously described in conjunction with FIG. 1A. In some embodiments, the offset may be a predefined direct current offset. In some embodiments, the predefined offset may be adjustable.

In some embodiments, at operation 208, the communication system uses a second event indicator embedded in the analog circuit to slice the offsetted signal to generate a sliced offsetted signal. In some embodiments, the analog circuit is the analog conditional one counting circuit previously described in conjunction with FIG. 1A and the second event indicator is the event indicator 108B previously described in conjunction with FIG. 1A.

In some embodiments, at operation 210, the communication system applies a first predefined delay to the sliced input signal. In some embodiments, the communication system applies the first predefined delay to the sliced input signal by utilizing one or more delay circuit units, such as the delay circuit units 110A to 110N previously described in conjunction with FIG. 1A. In some embodiments, the first predefined delay may be a combination of more than one predefined delays applied to the sliced input signal, such as the combination of delays applied by the delay circuit units 110A to 110N. In some embodiments, more than one predefined delays may be applied to the sliced input signal to generate multiple delayed signals from the sliced input signal. In such embodiments, the communication system may utilize a delay select module, such as the multiplexer 114 previously described in conjunction with FIG. 1A, to select one of the multiple delayed signals. In such embodiments, the combination of the one or more predefined delays applied to the selected one of the multiple delayed signal is the first predefined delay.

In some embodiments, at operation 212, the communication system applies a second predefined delay to the sliced offsetted signal. In some embodiments, the communication system applies the second predefined delay to the sliced offsetted signal by utilizing one or more delay circuit units, such as the delay circuit units 112A to 112N previously described in conjunction with FIG. 1A. In some embodiments, the second predefined delay may be a combination of one or more delays that are applied individually by each of the one or more delay circuit units 112A to 112N.

In some embodiments, at operation 214, the communication system generates a conditional ones signal based on the sliced input signal and the sliced offsetted signal. In some embodiments, the communication system utilizes an AND gate and a counter, such as the AND gate 116 and the counter 118 described in conjunction with FIG. 1A, to generate the conditional ones signal.

In some embodiments, at operation 216, the communication system uses the conditional ones signal to calibrate an equalizer embedded in the receiver. Details regarding using the conditional ones signal to calibrate an equalizer embedded in the receiver are described below in conjunction with FIG. 4.

FIG. 3 illustrates an example computing system 300 that may be embedded in the communication system. The computing system 300 may be used for performing calculations related to calibrating the equalizer embedded in the receiver. The computing system 300 may include or otherwise be in communication with a processor 310, memory circuitry 320, and communication circuitry 330. In some embodiments, the processor 310 (which may include multiple or co-processors or any other processing circuitry associated with the processor) may be in communication with the memory circuitry 320. The memory circuitry 320 may comprise non-transitory memory circuitry and may include one or more volatile and/or non-volatile memories. In some examples, the memory circuitry 320 may be an electronic storage device (e.g., a computer readable storage medium) configured to store data that may be retrievable by the processor 310. In some examples, the data stored in the memory 320 may include a calibration signal, a set of condition flags and statistics derived based on the condition flags, or the like for enabling the apparatus to carry out various functions or methods in accordance with embodiments of the present invention, described herein.

In some examples, the processor 310 may be embodied in a number of different ways. For example, the processor may be embodied as one or more of various hardware processing means such as a microprocessor, a coprocessor, a digital signal processor (DSP), a controller, or a processing element with or without an accompanying DSP. The processor 310 may also be embodied on various other processing circuitry including integrated circuits such as, for example, an FPGA (field programmable gate array), a microcontroller unit (MCU), an ASIC (application specific integrated circuit), a hardware accelerator, or a special-purpose electronic chip. Furthermore, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining, and/or multithreading. In some embodiments, the processor 310 is a microprocessor.

In an example embodiment, the processor 310 may be configured to execute instructions, such as computer program code or instructions, stored in the memory circuitry 320 or otherwise accessible to the processor 310. Alternatively or additionally, the processor 310 may be configured to execute hard-coded functionality. As such, whether configured by hardware or software instructions, or by a combination thereof, the processor 310 may represent a computing entity (e.g., physically embodied in circuitry) configured to perform operations according to an embodiment of the present invention described herein. For example, when the processor 310 is embodied as an ASIC, FPGA, or similar, the processor may be configured as hardware for conducting the operations of an embodiment of the invention. Alternatively, when the processor 310 is embodied to execute software or computer program instructions, the instructions may specifically configure the processor 310 to perform the algorithms and/or operations described herein when the instructions are executed. However, in some cases, the processor 310 may be a processor of a device (e.g., a mobile terminal or a fixed computing device) specifically configured to employ an embodiment of the present invention by further configuration of the processor by instructions for performing the algorithms and/or operations described herein. The processor 310 may further include a clock, an arithmetic logic unit (ALU) and logic gates configured to support operation of the processor 310, among other things.

The computing system 300 may optionally also include the communication circuitry 330. The communication circuitry may be any means embodied in either hardware or a combination of hardware and software that is configured to receive and/or transmit data from/to a network and/or any other device or module in communication with the computing system 300. In this regard, the communication interface may include, for example, supporting hardware and/or software for enabling communications. As such, for example, the communication circuitry 330 may include a communication modem and/or other hardware/software for supporting communication via cable, universal serial bus (USB), integrated circuit receiver, or other mechanisms.

FIG. 4 is a flowchart illustrating an example method of operation of a communication system embedded in a receiver having an analog conditional one counting circuit according to example embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operation illustrated in FIG. 4 may be performed by the analog conditional one counting circuit illustrated in FIG. 1A and the computing system 300 illustrated in FIG. 3.

In some embodiments, at operation 402, the communication system measures a signal histogram of a received signal. In some embodiments, the received signal may be the received signal previously described in conjunction with FIGS. 1 and 2. In some embodiments, the communication system utilizes an ones ratio counting circuit or the analog conditional one counting circuit that serves as a ones ratio counting circuit previously described in conjunction with FIG. 1A to measure the signal histogram. In some embodiments, the received signal encodes information in a plurality of bits. In some embodiments, the received signal is a PAM-4 signal.

In some embodiments, at operation 404, the communication system calculates a first distribution of the received signal based on the measured signal histogram. In some embodiments, the communication system may utilize the computing system 300 described in conjunction with FIG. 3 to perform the calculation of the first distribution parameter. A distribution parameter may take the form of a median, a statistic on a cut-off on a defined percentage, such as 25%, 50%, 75%, or the like, or other statistics deducible from measured histograms, ones ratios, or conditional ones ratios.

In some embodiments, at optional operation 406, the communication system selects a delay for the received signal. In some embodiments, the communication system selects the delay for the received signal according to a channel phase measurement to be performed. In some embodiments, the communication system may select the delay for the received signal by utilizing the multiplexer 114 described in conjunction with FIG. 1A.

In some embodiments, at operation 408, the communication system measures a conditional ones ratio of the received signal and calculates a second distribution parameter based on the conditional ones ratio measured. The operations related to measuring a conditional one ratio are previously described in conjunction with FIG. 2, for example, from operations 202 to 214 in FIG. 2. In some embodiments, the communication system may utilize the computing system 300 described in conjunction with FIG. 3 to perform the calculation of the second distribution parameter.

In some embodiments, at operation 410, the communication system may perform channel estimation by comparing the first distribution parameter and the second distribution parameter measured. By comparing the first distribution parameter and the second distribution parameter measured, the communication system may be able to deduce the impulse response of the channel. By measuring the histogram of an incoming signal and then measuring the conditional ones ratio, the communication system can enable measurement of the signal histogram under different conditions. Dependency between the signal and the conditions defined may be deduced by comparing differences in the distribution parameters of the signal histogram in different conditions. Such dependency can be used to derive the channel pulse response.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A method of channel estimation in a receiver of a communication system comprising:

receiving, via a receiver of a communication system, an input signal, wherein the input signal encodes a plurality of bits in a number of amplitude levels;

using a first event indicator embedded in an analog circuit of the receiver to slice the input signal to generate a sliced input signal;

applying an offset to the input signal to generate an offsetted signal;

using a second event indicator embedded in the analog circuit to slice the offsetted signal to generate a sliced offsetted signal;

applying a first predefined delay to the sliced input signal;

applying a second predefined delay to the sliced offsetted signal;

generating a conditional ones signal based on the sliced input signal and the sliced offsetted signal; and using the conditional ones signal to calibrate an equalizer embedded in the receiver.

2. The method of claim 1, wherein the input signal is a pulse amplitude modulation signal encoding the plurality of symbols in four amplitude levels.

3. The method of claim 1, wherein the input signal is a pulse amplitude modulation signal encoding the plurality of symbols in two amplitude levels.

4. The method of claim 1, wherein the offset is a predefined direct current offset.

5. The method of claim 1, wherein applying the first predefined delay to the sliced input signal comprises using a set of delay circuit units.

6. The method of claim 5, wherein applying the first predefined delay to the sliced input signal further comprises using a multiplexer to multiplex one or more outputs of the set of delay circuit units.

7. The method of claim 6, wherein applying the second predefined delay to the sliced offsetted signal comprises using a second set of delay circuit units.

8. The method of claim 7, wherein generating a conditional ones signal based on the sliced input signal and the sliced offsetted signal comprises:

feeding an output of the multiplexer and an output of the second set of delay circuit units into an AND gate; and using a counter to count an output of the AND gate.

9. An analog conditional one counting circuit embedded in a receiver of a communication system, wherein the analog conditional one counting circuit is configured to:

receive an input signal, wherein the input signal encodes a plurality of bits in a number of amplitude levels;

use a first event indicator embedded in an analog circuit of a receiver of a communication system to slice the input signal to generate a sliced input signal;

apply an offset to the input signal to generate an offsetted signal;

use a second event indicator embedded in the analog circuit to slice the offsetted signal to generate a sliced offsetted signal;

apply a first predefined delay to the sliced input signal;

apply a second predefined delay to the sliced offsetted signal;

generate a conditional ones signal based on the sliced input signal and the sliced offsetted signal; and use the conditional ones signal to calibrate an equalizer embedded in the receiver.

10. The analog conditional one counting circuit of claim 9, wherein the input signal is a pulse amplitude modulation signal encoding the plurality of symbols in four amplitude levels.

11. The analog conditional one counting circuit of claim 9, wherein the input signal is a pulse amplitude modulation signal encoding the plurality of symbols in two amplitude levels.

12. The analog conditional one counting circuit of claim 9, wherein the offset is a predefined direct current offset.

13. The analog conditional one counting circuit of claim 9, wherein applying the first predefined delay to the sliced input signal comprises using a set of delay circuit units.

14. The analog conditional one counting circuit of claim 13, wherein applying the first predefined delay to the sliced input signal further comprises using a multiplexer to multiplex one or more outputs of the set of delay circuit units.

15. The analog conditional one counting circuit of claim 14, wherein applying the second predefined delay to the sliced offsetted signal comprises using a second set of delay circuit units.

16. The analog conditional one counting circuit of claim 15, wherein generating a conditional ones signal based on the sliced input signal and the sliced offsetted signal comprises:

feeding an output of the multiplexer and an output of the second set of delay circuit units into an AND gate; and using a counter to count an output of the AND gate.

17. An analog conditional one counting circuit comprising:

a first event indicator and a second event indicator, wherein the first event indicator is configured to receive an input signal as input to generate a sliced input signal and the second event indicator is configured to receive an offsetted signal of the input signal as input to generate a sliced offsetted signal;

a first set of delay circuit units configured to generate one or more delayed signals based on the sliced input signal;

a second set of delay circuit units configured to generate a delayed offsetted signal based on the sliced offsetted signal;

a multiplexer configured to multiplex the one or more delayed signals;

an AND gate configured to receive an output of the multiplexer and the delayed offsetted signal as input; and a counter configured to count an output of the AND gate.

18. The analog conditional one counting circuit of claim 17, further comprising a counter configured to count the sliced offsetted signal.

* * * * *